(12) United States Patent
Ladd

(10) Patent No.: US 7,032,288 B2
(45) Date of Patent: Apr. 25, 2006

(54) METHODS FOR MAGNETICALLY ESTABLISHING AN ELECTRICAL CONNECTION WITH A CONTACT OF A SEMICONDUCTOR DEVICE COMPONENT

(75) Inventor: John W. Ladd, Shepherd, MT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/035,738

(22) Filed: Nov. 7, 2001

(65) Prior Publication Data

US 2002/0106911 A1 Aug. 8, 2002

Related U.S. Application Data

(63) Continuation of application No. 09/777,986, filed on Feb. 6, 2001, now Pat. No. 6,340,302.

(51) Int. Cl.
*H01S 4/00* (2006.01)

(52) U.S. Cl. ............... 29/593; 29/832; 29/830; 29/854; 439/38; 439/39; 439/40; 335/285

(58) Field of Classification Search ............. 29/592.1, 29/593, 830, 831, 832, 854; 439/38–40; 324/760; 335/285
See application file for complete search history.

(56) References Cited

U.S. PATENT DOCUMENTS 3,612,955 A * 10/1971 Butherus et al. ............ 361/779
3,691,628 A * 9/1972 Kim et al. ................... 29/832
3,855,693 A * 12/1974 Umbaugh .................... 29/843
4,025,964 A 5/1977 Owens
4,038,625 A 7/1977 Tompkins et al.
4,112,941 A 9/1978 Larimore
4,211,456 A 7/1980 Sears
4,317,969 A 3/1982 Riegler et al.
4,390,232 A 6/1983 Jamgotchian
4,479,685 A 10/1984 Kirby
4,538,863 A 9/1985 Allen et al.

(Continued)

*Primary Examiner*—Richard Chang
(74) *Attorney, Agent, or Firm*—TraskBritt

(57) ABSTRACT

An electrical connector configured to nonrigidly apply force to a semiconductor substrate in directions substantially normal to a plane of the semiconductor substrate includes a first member with an electrically conductive element and a first attractive element and a second member that includes a support element and a second attractive element. Attractive forces, such as magnetic attraction, between the first and second attractive elements secure the first and second members of the electrical connector to the semiconductor substrate in a manner that facilitates communication between the electrically conductive element of the first member and one or more semiconductor devices carried upon the semiconductor substrate. The electrical connector may be used in stress testing of semiconductor devices or to otherwise establish an electrical connection between one or more semiconductor devices, a ground, and a power source.

20 Claims, 3 Drawing Sheets

U.S. PATENT DOCUMENTS

| | | |
|---|---|---|
| 4,544,903 A | 10/1985 | Grant |
| 4,620,663 A * | 11/1986 | Odashima et al. ......... 228/44.7 |
| 4,719,334 A | 1/1988 | Rebel |
| 4,903,340 A | 2/1990 | Sorensen |
| 4,917,612 A | 4/1990 | Priest |
| 5,004,425 A | 4/1991 | Hee |
| 5,222,066 A | 6/1993 | Grula et al. |
| 5,382,167 A | 1/1995 | Janson, Jr. |
| 5,525,545 A * | 6/1996 | Grube et al. .................. 438/15 |
| 5,640,762 A | 6/1997 | Farnworth et al. |
| 5,796,264 A | 8/1998 | Farnworth et al. |
| 5,898,629 A | 4/1999 | Beffa et al. |
| 6,145,191 A * | 11/2000 | Baldwin ...................... 29/840 |
| 6,370,766 B1 * | 4/2002 | Degani et al. ................ 29/832 |
| 6,543,114 B1 * | 4/2003 | Atia et al. ............... 29/407.04 |

\* cited by examiner

METHODS FOR MAGNETICALLY ESTABLISHING AN ELECTRICAL CONNECTION WITH A CONTACT OF A SEMICONDUCTOR DEVICE COMPONENT

CROSS-REFERENCE TO RELATED APPLICATION

This application is a continuation of application Ser. No. 09/777,986, filed Feb. 6, 2001, now U.S. Pat. No.6,340,302, issued Jan. 22, 2002.

BACKGROUND OF THE INVENTION

1. Field of the Invention

The present invention relates to methods and apparatus for effecting wafer-level burn-in, or stress testing, of semiconductor devices and, more particularly, to apparatus and methods for establishing an electrical connection between semiconductor devices on a wafer or other substrate including multiple semiconductor devices thereon and burn-in test equipment. Specifically, the present invention relates to apparatus and methods that employ a magnetic field to establish an electrical connection between semiconductor devices carried upon a wafer or other substrate and burn-in test equipment.

2. Background of the Related Art

Once semiconductor devices have been fabricated, the semiconductor devices or representative samples thereof are typically subjected to a series of tests. These tests are intended to determine whether the semiconductor devices will meet various performance and reliability standards.

Stress testing, or burn-in testing, is one of the various types of tests that may be performed on semiconductor devices. Stress testing typically involves the application of a substantial amount of current to one or more semiconductor devices over a prolonged period of time and at an increased temperature or with varied temperature. For example, about 10 milliamps (mA) of current may be applied to each semiconductor device carried upon a substrate as the temperature of the semiconductor device is cycled between ambient temperature and a temperature of at least about 100° C. Such cycling of the temperature of the semiconductor device as current is being applied thereto is intended to stress the semiconductor device by driving any contaminants therein into the active circuitry thereof, thus causing failure of the semiconductor device. This type of stress testing is known in the art to cause the early failure of unreliable semiconductor devices, thereby preventing these unreliable semiconductor devices from being sold and used. As a result, semiconductor devices that pass such stress testing are typically more reliable than those which fail such stress tests.

Conventionally, stress testing equipment has included a carrier configured to hold one or more semiconductor devices during testing and a burn-in oven within which stress testing is conducted. Various types of carriers have been developed, including carriers for single, bare or packaged semiconductor devices, as well as wafer carriers. The carriers may include electrically conductive structures, such as pins, that contact the bond pads of each semiconductor device held by the carrier so as to apply an electrical current or a voltage to each semiconductor device held by the carrier.

Wafer carriers may alternatively be configured to establish an electrical connection with a multiplicity of semiconductor devices carried upon a wafer or other substrate by contacting one or more common contact locations formed on the wafer or other substrate. For example, it is known in the art to fabricate wafers with each of the semiconductor devices carried thereon in communication with a common ground contact and a common power ($V_{CC}$) contact, which are also carried upon the wafer. Conventionally, electrical connection of the common ground contact and the common power ($V_{CC}$) contact of such a wafer to ground and a power ($V_{CC}$) source, respectively, has been effected by use of clamping mechanisms, such as C-clamps or so-called "alligator clips" with planar conductive plates thereon.

When alligator clips are used to establish an electrical connection between the semiconductor devices on a wafer and a ground or a power source, a radial tangent force is applied to the substantially flat active surface and backside of the wafer at the locations of the ground contact and the power ($V_{CC}$) contact. While a low resistance electrical contact is established by use of such alligator clips, the radial tangent force applied by an alligator clip may cause the conductive plates on the alligator clip to contact only a small area of the respective contact formed on the active surface of the wafer and the opposing backside of the wafer. As a result, a large amount of pressure may be applied to a small area on the wafer, which may cause damage to the wafer that may, in turn, damage semiconductor devices carried by the wafer. In addition, as the temperature of the burn-in oven is increased, the alligator clips may expand and, thus, be moved along the wafer, which may also damage the wafer, as well as the semiconductor devices formed thereon.

While C-clamps contact larger areas of the respective common ground and power ($V_{CC}$) contacts formed on the active surface of a wafer, as well as larger areas on the backside of the wafer, and apply force to the wafer in a direction substantially normal, or perpendicular, to the plane of the wafer, C-clamps are relatively clumsy and would, therefore, likely increase the chance that a wafer is damaged as C-clamps are secured to their respective contacts. Moreover, when stress testing involves varied temperatures, the expansion of a C-clamp would increase the amount of force applied to the wafer, which could crack or otherwise damage the wafer, as well as semiconductor devices carried upon the wafer. Conversely, contraction of a C-clamp during cooling could result in an inadequate electrical connection between the C-clamp and its corresponding contact.

Due to the material expansion that typically occurs with the temperature variations of burn-in testing, the direction at which contact force is applied to a substrate by both alligator clips and C-clamps may deviate from normal (i.e., from a direction that is perpendicular to the plane of the substrate). As is known in the art, deviations in contact force may cause similar deviations in contact resistance. Even a small change in contact resistance may translate into a substantial drop in the voltage supplied ($V_{CC}$) to each semiconductor die on the substrate. For example, when the substrate is a wafer that carries 500 semiconductor dice, about 5 amps (A) of current are applied to the power supply ($V_{CC}$) contact of the substrate, or about 10 mA is supplied to each of the 500 dice. As calculated in accordance with Ohm's law, a small, 20 milliohms (m$\Omega$) increase in the contact resistance between an electrical connector of the burn-in test equipment and a common contact on the substrate would cause a substantial, 100 mV decrease in the voltage ($V_{CC}$) applied to the dice through the common contact. Thus, the amount of power and voltage applied to each die during wafer-level burn-in testing may not be consistent or repeatable when alligator clips or C-clamps are used to supply a burn-in voltage to dice through a common contact on the wafer or other substrate.

No known apparatus or method for establishing an electrical contact with a common contact on a wafer is available which does not induce stress on or in the wafer. No known apparatus or method in wafer-scale stress testing of semiconductor devices is available without applying too much force or too little force to the wafer.

BRIEF SUMMARY OF THE INVENTION

The present invention includes an electrical connector configured to establish an electrical connection between a ground or a power ($V_{CC}$) source and a common contact formed on a wafer without applying a potentially damaging amount of force to the wafer. The present invention also includes methods for assembling a wafer or other semiconductor substrate with stress testing equipment, as well as methods for wafer-level stress testing of semiconductor devices.

An electrical connector incorporating teachings of the present invention may include two opposed members, or contact plates, each of which is configured to be positioned against a surface of a wafer or other semiconductor substrate. In use, the two members of an electrical connector of the present invention are positioned on corresponding locations of opposite sides of a wafer or other semiconductor substrate and apply opposing forces to the wafer or other semiconductor substrate in directions normal to a plane of the wafer or other semiconductor substrate. The amounts of opposing force may be substantially equal. Accordingly, at least one of the two opposed members may include an attractive element, such as a magnet, which attracts a corresponding element of the oppositely positioned member. The corresponding element may, therefore, include a magnet of opposite polarity or a material, such as an iron-containing material, that may be attracted to a magnetic field. In addition, the electrical connector member that is to be biased against a common contact formed on the wafer or other semiconductor device includes an electrically conductive element, while the other, opposite member of the electrical connector may include an electrically nonconductive support element configured to engage a backside of the wafer or other semiconductor substrate. The support element may also be configured to cushion the backside of the semiconductor substrate.

A method for establishing an electrical connection in accordance with teachings of the present invention includes positioning a first member of an electrical connector in electrically conductive contact with a contact of a semiconductor device structure, such as a wafer, another substrate carrying a plurality of semiconductor devices, or a single semiconductor device. A second member of the electrical connector is positioned in a corresponding location on an opposite side of the semiconductor device structure. The first and second members of the electrical connector nonrigidly apply opposed force to the semiconductor device structure in directions substantially normal to a plane of the semiconductor device structure. The amounts of opposed force applied to the semiconductor device structure by the first and second members are preferably substantially equal. Preferably, the amounts of force applied by the first and second members of the electrical connector to the semiconductor device structure are also sufficient to establish electrical communication between the first member and the contact without inducing potentially damaging stresses in the semiconductor device structure. The opposed forces may be generated by magnetic attraction of the first and second elements of the electrical connector to one another, by other known, nonrigid attractive forces, or by other nonrigid securing means for forcing two objects directly toward one another.

A method for stress testing semiconductor devices in accordance with teachings of the present invention includes nonrigidly securing a first electrical connector of the present invention to a ground contact in communication with the semiconductor device and nonrigidly securing a second electrical connector of the present invention to a power ($V_{CC}$) contact in communication with the semiconductor device, with the first and second electrical connectors each being biased against their respective contacts in a direction substantially normal to a plane of the semiconductor device. The stress testing method also includes establishing communication in between the first electrical connector and a ground and establishing communication between the second electrical connector and a power ($V_{CC}$) source, or supply. In addition, stress testing in accordance with teachings of the present invention includes exposing the semiconductor device to an increased temperature or varying the temperature of the semiconductor device, such as by cycling the temperature of the semiconductor device, increasing the temperature of the semiconductor device, or decreasing the temperature of the semiconductor device.

Other features and advantages of the present invention will become apparent to those of ordinary skill in the art through a consideration of the ensuing description, the accompanying drawings, and the appended claims.

BRIEF DESCRIPTION OF THE SEVERAL VIEWS OF THE DRAWINGS

In the drawings, which illustrate exemplary embodiments of the present invention.

DETAILED DESCRIPTION OF THE INVENTION

Figure 1:
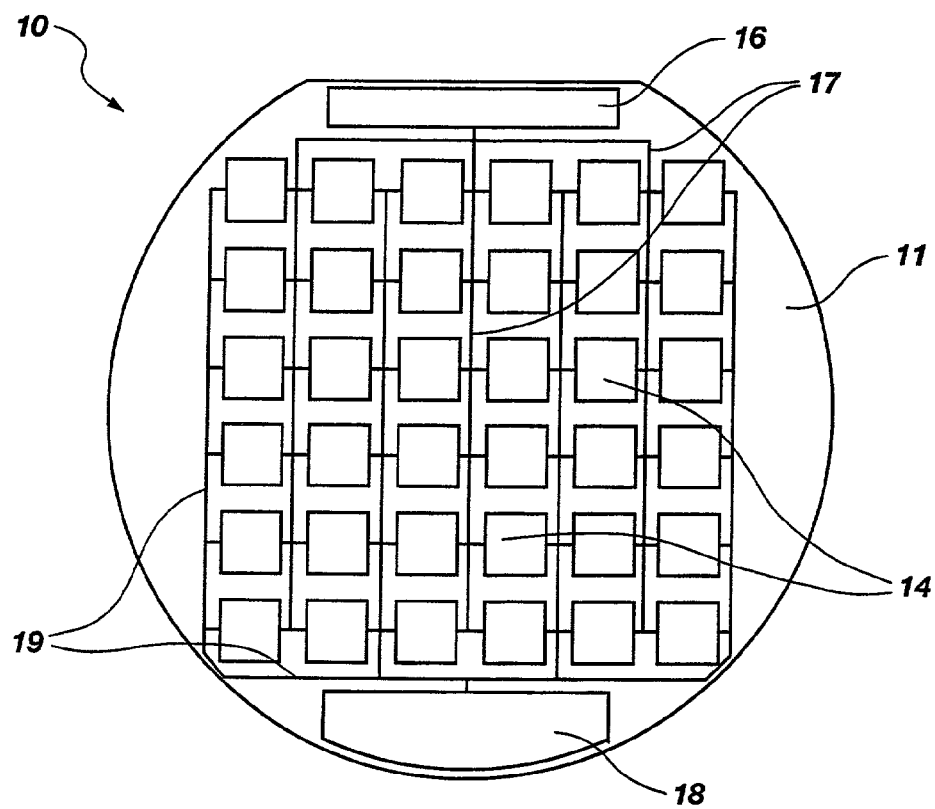
FIG. 1 is a schematic representation of a semiconductor wafer including a plurality of semiconductor devices fabricated thereon, each semiconductor device communicating with both a common ground contact and a common power ($V_{CC}$) contact, which are also fabricated on the semiconductor wafer.

A semiconductor wafer, referred to herein as a substrate 10, which includes a plurality of semiconductor devices 14 carried upon an active surface 11 thereof, is illustrated in FIG. 1. Substrate 10 also includes, on active surface 11, a common ground contact 16 and a common power ($V_{CC}$) contact 18. Common ground contact 16 and common power ($V_{CC}$) contact 18 both communicate with a number of different semiconductor devices 14 on substrate 10 by way of respective circuit traces 17, 19 carried upon active surface 11 of substrate 10. Although substrate 10 is illustrated in FIG. 1 as a semiconductor wafer, the hereinafter described electrical connector of the present invention may be used with other substrates, including, without limitation, individual semiconductor dice, full or partial wafers formed of semiconductive material (e.g., silicon, gallium arsenide, iridium phosphide, etc.), and silicon-on-insulator (SOI) substrates, such as silicon-on-glass (SOG), silcon-on-sapphire (SOS), and silicon-on-ceramic (SOC).

Figure 2:
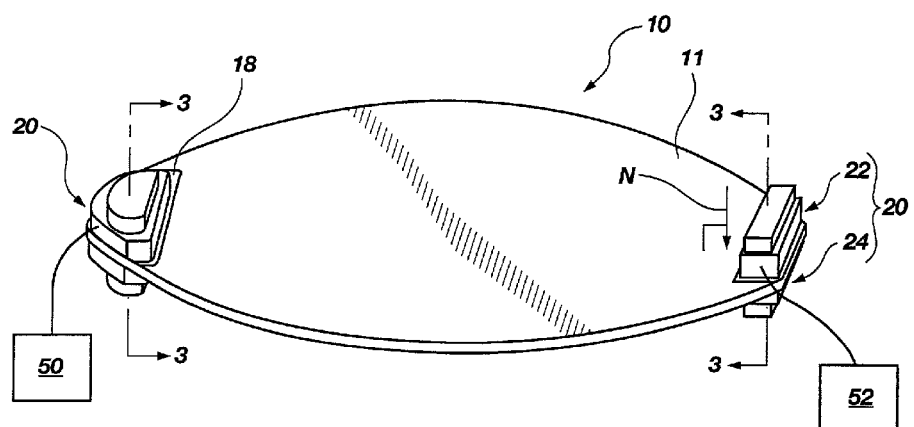
FIG. 2 is a perspective assembly view of an electrical connector embodying teachings of the present invention electrically connected to the semiconductor wafer shown in FIG. 1.
Figure 3:
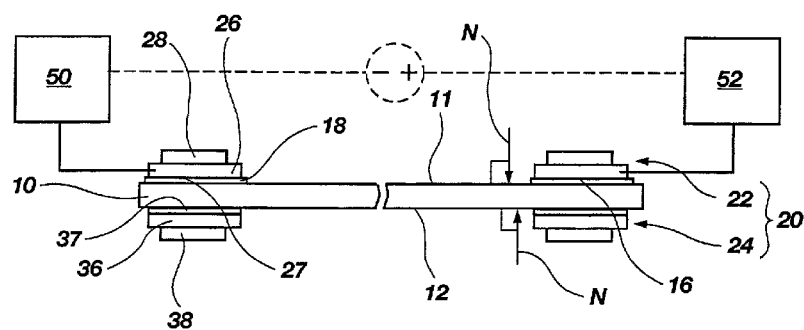
FIG. 3 is a cross-sectional representation taken along line 3—3 of FIG. 2.

Referring now to FIGS. 2 and 3, an exemplary embodiment of an electrical connector 20 incorporating teachings of the present invention is illustrated. Electrical connector 20 includes a first member 22 and a second member 24. As illustrated, first member 22 is configured to establish an electrical connection with each contact 16, 18 of a substrate 10. Second member 24 is configured to engage backside 12 of substrate 10 in a manner that nonrigidly draws first member 22 against contact 16, 18 in a direction that is substantially normal, or perpendicular, to a plane of substrate 10, as indicated by arrow N.

With continued reference to FIGS. 2 and 3, first member 22 of electrical connector 20 includes an electrically conductive element 26 with a substantially planar contact surface 27 configured to engage a contact 16, 18 of a substrate 10. First member 22 also includes a first attractive element 28.

Electrically conductive element 26 is preferably formed from a suitable conductive material that will have sufficiently low contact resistance with the material of contacts 16, 18 so as to facilitate the application of a suitable voltage to each semiconductor device 14 in communication with contacts 16, 18 while minimizing the amount of power dissipated by the interface of contact 16, 18 and an electrically conductive element 26 contacting same. Preferably, the contact resistance between electrically conductive element 26 and contacts 16, 18 is about 100 m$\Omega$ or less. By selecting a conductive material that will have such low contact resistance with a material of contacts 16, 18, the likelihood that substrate 10 will be heated to an excessive temperature by electrical resistance at the interface between a contact 16, 18 and an electrically conductive element 26 is reduced. The likelihood that substrate 10 will be damaged by excessive temperatures is also reduced when the contact resistance between the material of electrically conductive element 26 and contact 16, 18 is low. Exemplary materials that may be used to form electrically conductive element 26 include, without limitation, gold, nickel, copper, tungsten, or an alloy including any of these materials. Electrically conductive element 26 is configured to communicate with one of a ground 50 and a power ($V_{CC}$) source 52 to form at least a portion of a circuit including power ($V_{CC}$) source 52, at least one semiconductor device 14 on substrate 10, and ground 50.

First attractive element 28 is configured to attract or to be attracted by a corresponding, second attractive element 38 of second member 24 of electrical connector 20. By way of example, and not to limit the scope of the present invention, first attractive element 28 and second attractive element 38 may be magnetically attracted to one another. Accordingly, in this example, first attractive element 28 may comprise, but is not limited to, a magnetic material, an electromagnet, or a material that is attracted to a magnetic field (e.g., iron or an iron-containing material). Alternatively, first attractive element 28 may include an electrically nonconductive matrix impregnated with particles of magnetic material.

Figure 3A:
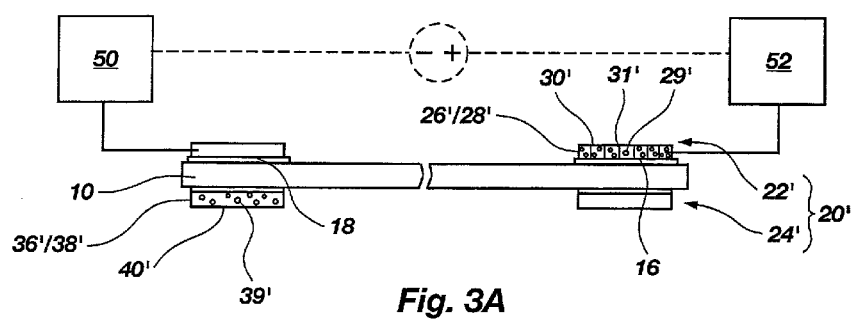
FIG. 3A is a cross-sectional representation illustrating variations of the members of electrical connectors incorporating teachings of the present invention.

In alternative embodiments, the electrically conductive and attractive elements of an electrical connector incorporating teachings of the present invention may be fully or partially combined. As shown in FIG. 3A, an electrical connector 20' includes a first member 22' with a combined electrically conductive/attractive element 26'/28'. Combined element 26'/28' may comprise a matrix material 30' impregnated with electrically conductive, Z-axis type filaments, or particles 31', and attractive particles 29'. Upon positioning first member 22' with combined element 26'/28' in contact with a common contact 16, 18 (FIG. 1) of a substrate 10 an electrical connection is established between first member 22' and one or more semiconductor devices 14 (FIG. 1) on substrate 10. Matrix material 30' may be a relatively soft, pliable material, such as silicone or another elastomer, so as to prevent common contact 16, 18 from being damaged as first member 22' is positioned thereagainst.

With returned reference to FIGS. 2 and 3, second member 24 of electrical connector 20 includes a support element 36 with second attractive element 38 coupled thereto. Support element 36 is configured to engage backside 12 of substrate 10, opposite from the location at which first member 22 is positioned over active surface 11. Support element 36 includes a contact surface 37, which is preferably planar so as to facilitate the application of force against backside 12 in a direction that is substantially normal, or perpendicular, to a plane of substrate 10. Support element 36, including contact surface 37 thereof, may be formed from any suitable, substantially rigid material to facilitate the application of force against backside 12 of substrate 10. For example, but not to limit the scope of the present invention, support element 36 may be formed from an electrically conductive material (e.g., the same material as that employed to form contact surface 27 of electrically conductive element 26 of first member 22 of electrical connector 20) or an electrically nonconductive material (e.g., glass, ceramic, a resin, or an elastomer). As shown, contact surface 37 may be coated or lined with a softer, more pliable material, such as silicon or another elastomer, to cushion and to prevent damage to substrate 10 as electrical connector 20 is secured thereto, as well as to electrically insulate second member 24 of electrical connector 20 from backside 12 of substrate 10.

Second attractive element 38 of second member 24 is configured to attract or to be attracted by the corresponding first attractive element 28 of first member 22. Accordingly, if first attractive element 28 comprises an electromagnet or a magnetic material, second attractive element 38 may comprise a magnet or electromagnet of opposite polarity or a material (e.g., iron or an iron-containing material) that is attracted to a magnetic field. Alternatively, if first attractive element 28 comprises a material that is attracted to a magnetic field, second attractive element 38 may comprise a magnetic material or an electromagnet.

A variation of a second member 24' of an electrical connector 20' incorporating teachings of the present invention includes a combined support element/attractive element 36'/38', as illustrated in FIG. 3A. As depicted, combined element 36'/38' includes a matrix material 40' impregnated with particles 39' of attractive material. As in the examples provided previously herein, attractive particles 39', may be magnetically attracted to an attractive element 28, 28' of a corresponding first member 22, 22'. Accordingly, depending upon the material used in attractive element 28, 28', attractive particles 39' may comprise a magnetic material or a material that is attracted to a magnetic field. Matrix material 40' may comprise either a rigid material, such as an elastomer or a resin, or a softer, more pliable material, such as silicone or another soft elastomer.

Figure 5:
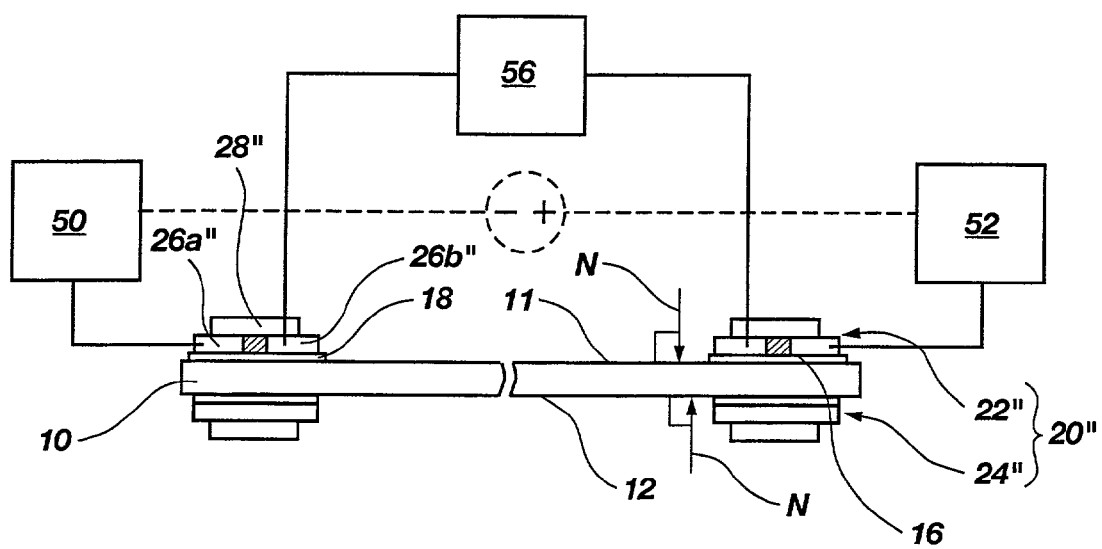
FIG. 5 is a cross-sectional representation of an embodiment of a Kelvin connector incorporating teachings of the present invention.

With reference to FIG. 5, a Kelvin connector 20" incorporating teachings of the present invention is illustrated. Kelvin connector 20" includes a first member 22" and a second member 24". As illustrated, first member 22" is configured to establish two separate electrical connections with each contact 16, 18 of a substrate 10. Second member 24" is configured to engage backside 12 of substrate 10 in a manner that nonrigidly draws first member 22" against contact 16, 18 in a direction that is substantially normal, or perpendicular, to a plane of substrate 10, as indicated by arrow N.

As the electrical connector depicted in FIG. 5 is a Kelvin connector, first member 22" includes two electrically conductive elements 26a", 26b", one of which (e.g., electrically conductive element 26a") applies a current to a substrate 10, the other of which (e.g., electrically conductive element 26b") facilitates monitoring, by a monitoring device 56 of a known type, of the current and/or voltage applied to substrate 10. Each electrically conductive element 26a", 26b" may be configured as described previously herein with respect to conductive elements 26 illustrated in FIGS. 2 and 3. First member 22" also includes a first attractive element 28".

Second member 24" of Kelvin connector 20" may be configured as electrical connector 20 illustrated in FIGS. 2 and 3 and described herein with reference to FIGS. 2 and 3. Accordingly, second member 24" facilitates the securing of first member 22" to a contact 16, 18 of substrate 10 by nonrigidly attracting first member 22" against substrate 10 in a direction substantially normal to a plane of substrate 10.

Kelvin connector 20" facilitates the monitoring of a current and/or voltage that is applied to one or more semiconductor devices, as well as the adjusting of such current and/or voltage. Accordingly, when Kelvin connector 20" is used to establish an electrical connection with one or more semiconductor devices, such as in stress, or burn-in, testing, a desired, appropriate amount of current and/or voltage may be applied to one or more semiconductor devices 14 over a specified duration of time. If the current and/or voltage shifts, such shifts may be monitored and appropriate adjustments may be made, as known in the art.

Referring again to FIGS. 2 and 3, an example of the use of electrical connector 20 to establish electrical communication with a contact 16 of a substrate 10 is illustrated. First member 22 of electrical connector 20 is positioned over contact 16 and electrically conductive element 26 thereof is brought into contact with contact 16. Second member 24 is positioned under backside 12 of substrate 10 in a location opposite the position of contact 16 on active surface 11. Once both first and second members 22, 24 have been appropriately positioned, a nonrigid attractive force between first member 22 and second member 24 secures both first and second members 22, 24 to substrate 10 in such a manner that electrically conductive element 26 of first member 22 will electrically communicate with contact 16. For example, without limiting the scope of the present invention, magnetic attraction between first and second members 22, 24 or elements thereof may secure first and second members 22, 24 to opposite sides of substrate 10. Preferably, the attractive forces are sufficient to maintain an adequate electrical contact between electrically conductive element 26 of first member 22 and contact 16 of substrate 10 without stressing substrate 10 to a degree that may damage substrate 10 or any semiconductor devices 14 carried thereby. In addition, due to the planar contacting surfaces 27, 37 of electrically conductive element 26 and support element 36, respectively, the attractive forces between attractive elements 28 and 38 are applied to substrate 10 in directions that are substantially normal to a plane thereof.

In an exemplary use of an electrical connector 20 incorporating teachings of the present invention, electrical connectors 20 or other electrical connectors according to the invention that communicate with each of a ground 50 and a power ($V_{CC}$) source 52 may be nonrigidly secured to substrate 10 so as to communicate with contacts 16, 18 that, in turn, communicate with one or more semiconductor devices 14 to be stress tested. Upon securing electrical connectors 20 to substrate 10 in such a manner, both members 22, 24 of electrical connector 20 apply force to substrate 10 in a direction that is substantially normal to a plane of substrate 10.

Figure 4:
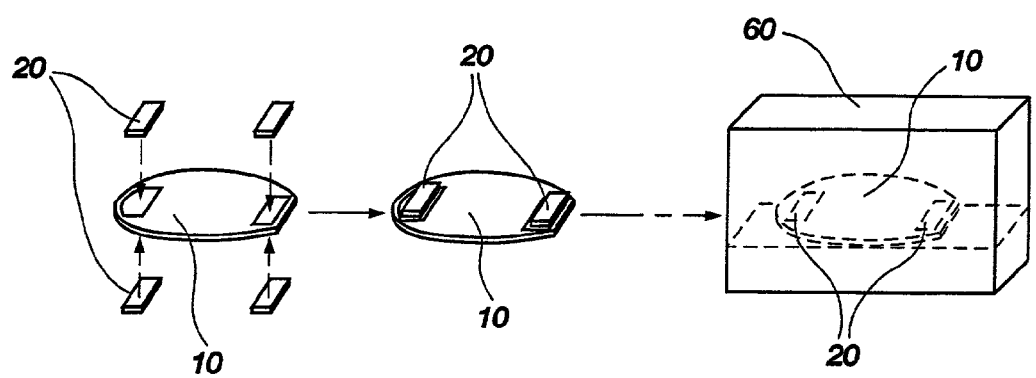
FIG. 4 is a schematic representation of a stress testing, or burn-in, process according to the present invention.

As shown in FIG. 4, substrate 10 and electrical connectors 20 secured thereto are placed within a burn-in oven 60. A preferably substantially constant electrical current is then applied to each semiconductor device 14 carried by substrate 10 through electrical connectors 20 and the temperature of burn-in oven 60 is increased. The temperature of burn-in oven 60 may be increased to a substantially steady temperature or may be varied, as is known in stress testing of semiconductor devices. For example, with reference to FIG. 1, when substrate 10 is a wafer including a plurality of semiconductor devices 14, such as dynamic random access memory (DRAM) devices or static random access memory (SRAM) devices and includes common contacts 16, 18 for connection of each semiconductor device 14 on substrate 10 to a ground 50 and a power ($V_{CC}$) source 52, such as that depicted in FIG. 1, sufficient current (e.g., about 6–10 amps) is applied to contacts 16, 18 of substrate 10 to permit each semiconductor device 14 carried thereby to draw about 10 mA. In addition, the temperature of burn-in oven 60 may be cycled during the stress testing process. Of course, electrical connectors incorporating teachings of the present invention, as well as methods of the present invention may also be used to facilitate electrical connections in other testing and use applications.

Although the foregoing description contains many specifics, these should not be construed as limiting the scope of the present invention, but merely as providing illustrations of selected, preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention, as disclosed herein, which fall within the meaning and scope of the claims are embraced within their scope.

What is claimed is:

1. A method for establishing a temporary electrical contact with at least one semiconductor device, comprising:
   magnetically drawing at least one of a first member of an electrical connector and a contact that is in electrical communication with at least one semiconductor device toward the other of the first member and the contact to establish a temporary electrical contact between the first member and the contact; and
   permitting an electrical current to flow from at least one of the electrical connector and the contact to the other of the contact and the electrical connector as the temporary electrical contact is maintained.

2. The method of claim 1, wherein magnetically drawing is effected in a direction substantially normal to a plane of the contact.

3. The method of claim 1, wherein magnetically drawing is effected in a direction substantially normal to a plane of a substrate upon which the contact is carried.

4. The method of claim 1, wherein magnetically drawing is effected by positioning a second member of the electrical connector opposite the first member.

5. The method of claim 4, wherein magnetically drawing is effected by magnetically attracting at least one of the first member and the second member toward at least the other of the first member and the second member.

6. The method of claim 4, wherein magnetically drawing comprises securing the first and second members to a substrate upon which the contact is carried.

7. The method of claim 1, wherein magnetically drawing comprises magnetically securing the first member to the contact.

8. A method for stress testing a plurality of semiconductor devices carried upon a common substrate and in communication with common ground and power contacts, compnsing:
   magnetically drawing at least one of a first member of an electrical connector and at least one contact of a ground contact and a power contact toward the other of the first member and the at least one contact to establish and maintain a temporary electrical contact between the first member and the at least one contact; and
   permitting an electrical current to flow from at least one of the electrical connector and the contact to the other of the contact and the electrical connector as the temporary electrical contact is maintained.

9. The method of claim 8, wherein magnetically drawing is effected in a direction substantially normal to a plane of the common substrate.

10. The method of claim 8, wherein the magnetically drawing nonrigidly biases the first member against the at least one contact.

11. The method of claim 8, wherein magnetically drawing comprises positioning a second member of the electrical connector opposite the substrate from the first member.

12. The method of claim 11, wherein at least one of the first member and the second member is drawn toward at least the other of the first member and the second member.

13. The method of claim 12, wherein magnetically drawing comprises magnetically attracting at least one of the first member and the second member toward at least the other of the first member and the second member.

14. The method of claim 8, wherein magnetically drawing comprises magnetically securing the first member to the at least one contact.

15. The method of claim 8, wherein magnetically drawing comprises securing at least the first member in position relative to the common substrate.

16. The method of claim 8, further comprising:
   electrically connecting another first member of another electrical connector to another of the ground contact and the power contact; and
   magnetically drawing the another first member toward the another contact.

17. The method of claim 16, further comprising:
   applying a substantially constant amount of current to each semiconductor device of the plurality of semiconductor devices through the first member and the another first member.

18. The method of claim 17, further comprising:
   heating each of the plurality of semiconductor devices.

19. The method of claim 18, wherein heating comprises cycling a temperature of each of the plurality of semiconductor devices.

20. The method of claim 18, wherein heating comprises varying a temperature of each of the plurality of semiconductor devices.

* * * * *